United States Patent [19]

Rose et al.

[11] Patent Number: 4,792,378
[45] Date of Patent: Dec. 20, 1988

[54] GAS DISPERSION DISK FOR USE IN PLASMA ENHANCED CHEMICAL VAPOR DEPOSITION REACTOR

[75] Inventors: Alan D. Rose, Wylie, Tex.; Robert M. Kennedy, III, Taylors, S.C.

[73] Assignee: Texas Instruments Incorporated, Dallas, Tex.

[21] Appl. No.: 132,305

[22] Filed: Dec. 15, 1987

[51] Int. Cl.⁴ .................. B44C 1/22; B05B 5/02; C23C 14/00; C03C 15/00
[52] U.S. Cl. .................. 156/643; 118/50.1; 118/728; 118/620; 156/345; 156/646; 204/192.12; 204/298; 427/38
[58] Field of Search .............. 156/345, 643, 646; 118/728, 50.1, 620; 204/192.12, 192.32, 192.3, 298; 427/38, 39; 422/186.05, 186.06

[56] References Cited

U.S. PATENT DOCUMENTS 4,209,357 6/1980 Gorin et al. .................. 156/345 X
4,534,816 8/1985 Chen et al. .................. 156/643 X
4,590,042 5/1986 Drage .................. 422/186.06

Primary Examiner—William A. Powell
Attorney, Agent, or Firm—Frederick J. Telecly, Jr.; Thomas W. DeMond; Melvin Sharp

[57] ABSTRACT

A chemical vapor transport reactor gas dispersion disk (20) for counteracting vapor pressure gradients to provide a uniform deposition of material films on a semiconductor slice (37). The disk (20) has a number of apertures (22) arranged so as to increase in aperture area per unit of disk area when extending from the center of the disk (20) to its outer peripheral edge.

22 Claims, 1 Drawing Sheet

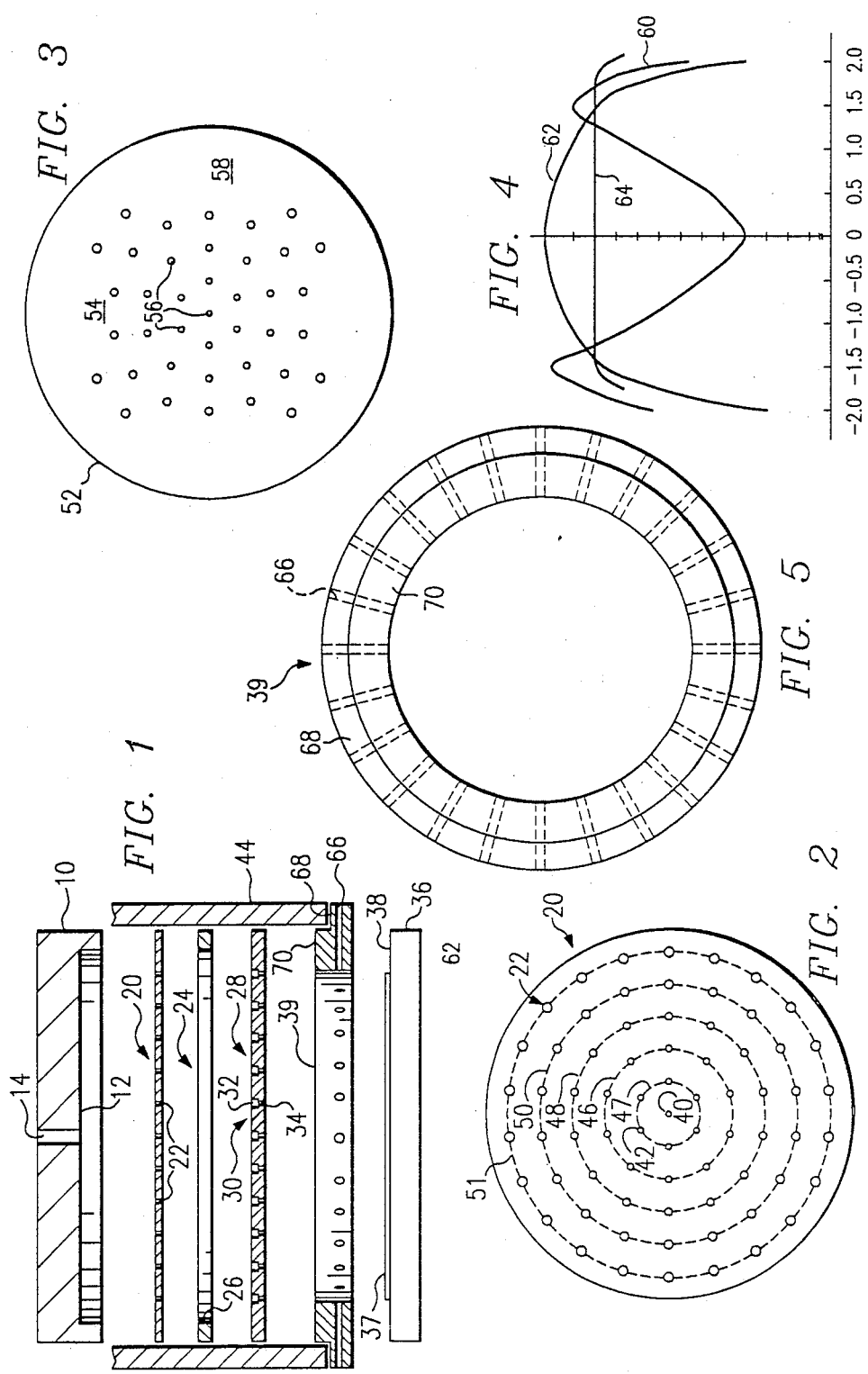

GAS DISPERSION DISK FOR USE IN PLASMA ENHANCED CHEMICAL VAPOR DEPOSITION REACTOR

RELATED APPLICATION

"Apertured Ring For Exhausting Plasma Reactor Gasses", by Alan D. Rose, filed concurrently herewith, Ser. No. 132,306.

TECHNICAL FIELD OF THE INVENTION

The present invention relates in general to chemical vapor deposition apparatus, and more particularly relates to methods and apparatus for controlling the gas distribution in such reactors.

BACKGROUND OF THE INVENTION

The fabrication of semiconductor circuits has been greatly facilitated by the use of plasma reactors, and similar equipment. In fabricating semiconductor integrated circuits, such equipment is employed for depositing layers or films of conductive material, semiconductor material or insulating materials in various patterns and configurations to form microcircuits. Dry etching of semiconductor materials can also be conducted with chemical vapor transport systems to selectively remove desired areas of such materials. Generally, a number of identical and individual integrated circuits are fabricated on a circular semiconductor wafer or slice. Well-known batch reactors are constructed to accommodate a number of such slices in a single reaction chamber and thereby simultaneously perform the material deposition or etching of all the slices.

More recently, single slice processing reactors have been developed to increase the product uniformity in accordance with current advanced semiconductor processes. The small chamber of a single slice reactor enables easier control of the operating variables, such as gas flow and energy distribution, than the larger chambers of the multi-slice batch reactors. However, undesirable pressure and flow gradients within the single slice reactor can be larger, especially in the vicinity of the slice, due to the close proximity of the reactor chamber vacuum ports and injection nozzles to the slice. This condition necessitates the utilization of equipment for controlling such gradients.

Heretofore, shower head apparatus has been utilized for dispersing the reactant gases over the slice so as to provide a uniform flow thereover. Notwithstanding, such shower head equipment does not address the problems of the nonuniform distribution of gases in the plasma due to the location of vacuum ports through which the spent gas is withdrawn from the reaction chamber. With such shower head apparatus, nonuniformity in the material deposition or etch rate may occur during the chemical vapor transport process. Conventional single slice, parallel electrode reactors inject reactant gases into the reaction chamber through one of the noted electrodes. Sintered stainless steel disks having a uniformly porous structure comprise such electrodes, and pressure gradients are employed to force the diffusion of gases through such electrode. More commonly, nonporous disks having uniformly spaced holes therein are utilized as the electrode structure. This type of apertured disk is common in many plasma reactors in current use today. U.S. Pat. No. 4,534,816 discloses such a plasma reactor with an apertured electrode disk having uniformly spaced and sized holes formed therein.

The plasma reactor of the noted patent relies on the injection of a gas and two pressure drops therein for ensuring uniformity of flow. The first pressure drop occurs across a baffle upstream from the electrode which produces the second pressure drop. With this structure, it is attempted to inject the gas uniformly over the entire surface of the slice, without addressing the radial nonuniformities which form as the gas is evacuated around the circumference of the slice. The flow is therefore radially nonuniform from the center of the slice to the circumferential edge thereof. The disadvantage of this radial outward flow is the nonuniformity of various process parameters which occur due to the pressure gradient existing over the surface of the slice. As a result, the deposition of a layer of material in the center of the slice may be thicker than that which is deposited near the edge of the slice. The various integrated circuits fabricated on the slice may then exhibit different electrical characteristics.

From the foregoing, it can be seen that a need exists for an improved plasma reactor which provides a uniform dispersion of plasma gases over the surface of the slice to thereby provide an overall uniform depth of material deposited or etched therefrom. A further need exists for apparatus for use with plasma reactors for providing a uniform distribution of plasma gases in a desired pattern for depositing material only on selected surfaces of the slice.

SUMMARY OF THE INVENTION

In accordance with the present invention, the disclosed chemical vapor reactor apparatus and methods substantially reduce or eliminate the disadvantages and shortcoming associated with the prior art techniques. According to the invention, an apertured gas dispersion disk is provided for counteracting the natural pressure gradients arising within the reactor chamber so that a uniform deposit or removal of material can be achieved over the entire surface of the semiconductor slice. A highly important technical advantage of the invention is that product consistency is achieved, in that uniform layers of material can be deposited, or etched, from the surface of the slice. Each of the many chips of a slice is thus more identical in physical construction and electrical operation.

The gas dispersion disk of the invention is apertured in accordance with the pressure gradients within the reactor chamber so that in chamber areas where there is a high pressure, the density of holes in the disk is less than at other chamber areas where the pressure is less. The technical advantage of this feature is that the gas which does pass through the apertured disk is uniform in distribution when it is exposed to the semiconductor slice.

In the preferred form of the invention, the apertured gas dispersion disk is adapted for counteracting pressure gradients which are typically high at the center of the input side of the disk and decrease radially outwardly to the edge of the disk. For this type of pressure gradient, the gas dispersion disk is constructed such that the ratio of the apertured area per unit of disk area increases from the center of the disk, outwardly. In one embodiment, the gas dispersion disk includes holes located in a pattern of concentric circles on the disk, with the diameter of such holes increasing, as located from the center of the disk toward the outer circumferential edge thereof.

In another embodiment, the diameter of each hole may be the same, but the number of holes of each outlying concentric circle is increased.

In yet another other embodiment of the invention, the overall pattern of the plasma gas can be controlled by entirely eliminating holes in the disk at certain areas, and providing a apertured pattern in other areas where it is desired for the plasma gas to pass therethrough.

The apertured disk of the invention functions in cooperation with an apertured annular ring which efficiently evacuates the gases from the chamber so that the uniform distribution thereof is not disturbed. The annular apertured ring also maintains a predetermined spaced relationship between a slice holder and a collimator assembly. The technical advantage of this arrangement is that a uniform thickness of a film can be deposited, while yet limiting the area of deposition so that nonuseable peripheral areas of the slice are not subjected to the plasma gases.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which:

FIG. 1 is a simplified sectional view of a portion of single slice chemical vapor transport reactor in which semiconductor slices are individually processed;

FIG. 2 illustrates a plan view of a gas dispersion disk according to the invention;

FIG. 3 is a plan view of another embodiment of a gas dispersion disk according to the invention;

FIG. 4 graphically depicts various chemical vapor deposition material profiles versus the aperture patterns formed in the gas dispersion disk; and FIG. 5 is a top view of an apertured annular ring for use in evacuating plasma gases from the reaction chamber.

DETAILED DESCRIPTION OF THE INVENTION

FIG. 1 illustrates in simplified form the basic components of a chemical vapor transport reactor which are associated with the reaction chamber of the invention. While the present invention is described in terms of a plasma reactor, the principles and concepts of the invention apply equally as well to chemical vapor deposition reactors. In addition, the invention can be utilized with equal advantage for depositing uniform layers of a film of material on a semiconductor substrate, or for removing uniform layers of material by dry etching.

The primary elements of the reactor chamber comprise an electrode 10 having a recessed area 12 and a gas inlet port 14. While not shown, the electrode 10 may include an exterior water jacket for cooling purposes, and connections to which radio frequency (RF) power can be connected to establish a plasma reaction. The electrode 10 is typically constructed of a conductor for carrying the RF energy.

A gas dispersion disk 20 having a number of apertures 22 lies adjacent a recessed area 12 of the electrode 10 in abutment with a lower prejection on the electrode 10. The gas dispersion disk 20 can be constructed of a rigid material, such as anodized aluminum. To be described in more detail below, the aperture area per unit of disk area of the gas dispersion disk 20 varies in correspondence with the pressure gradients within the reactor chamber. With this arrangement, there is achieved a uniform deposition of material, or the etching of a material from the slice.

The reactor apparatus also includes a spacer 24 which is torus shaped with a large opening 26. The spacer 24 functions to maintain the gas dispersion disk 20 spaced a predetermined distance away from a shower head electrode 28. The shower head electrode 28 has a number of holes 30, each constructed in a stepped manner so as to provide a large diameter hole 32 and a smaller diameter hole 34. The holes 30 in the shower head electrode 28 are all substantially the same size, and evenly distributed over the surface of the shower head electrode 28. The shower head electrode 28 is of conventional construction.

Fixed between the shower head electrode 28 and the slice holder 36 is an apertured annular ring 39 for providing an outlet of the gas vapors from the reactor chamber. The apertured annular ring 39 is described in more detail in the noted related application. A semiconductor slice 37 is fixed by means not shown to the top surface 38 of the slice holder 36, and is thereby exposed to the gas vapors passing through the shower head 28.

The shower head electrode 28, the spacer ring 24 and the gas dispersion disk 20 are fastened to the electrode 10 by a jar lid type of threaded fastener (not shown). It can be appreciated that such a fastener is essentially a threaded annular ring with a flange engageable with the shower head electrode 28 for clamping the assembly to the electrode 10. The apertured annular ring 39 and slice holder 36 can also be fastened to the reactor by the fastener, or by any other conventional technique. A collimator 44, to be discussed below, forms a housing for the noted reactor elements.

With the noted reactor apparatus, chemical vapors are introduced into the reactor chamber through the electrode gas inlet 14 and passed through the gas dispersion disk 20. The gas dispersion disk 20 functions as a selective barrier and is thus effective to counteract gradient pressures existing above such disk, and provide a uniform flow of vapors through the shower head 28 for distribution over the entire surface of the slice 37. In this respect, the gas dispersion disk 20 separates the plasma reaction chamber into a gas inlet section and a slice processing section. The gases passing from the inlet section, which section is typically characterized as having gas pressure gradients, is transformed by the gas dispersion disk 20 into uniform gas pressures which are applied to the slice 37. The vapor gases are then removed from the reaction chamber through the apertured annular ring 39, as noted.

FIG. 2 is a plan view of the preferred embodiment of the gas dispersion disk 20 of the invention. As noted above, the gas dispersion disk 20 includes an arrangement of apertures 22 which are tailored to the particular pressure gradients existing within the reactor chamber to thereby provide a uniform flow of gas vapors to the semiconductor slice 37. With a uniform exposure to the various gas vapors to the slice 37, uniform layers of materials, such as silicon dioxides, silicon nitrides, and other conductive and nonconductive materials can be deposited with very precise layer thicknesses, at any location on the slice 37.

The technical advantage of such a gas dispersion disk 20 allows layers of material having thicknesses of several hundred atoms to be deposited or removed at any location on the slice 37. This is particularly important in current semiconductor fabrication techniques where the semiconductor circuits are scaled to achieve smaller circuits which require correspondingly thinner layers of various materials. Moreover, with the ability to construct material layers of uniform thickness anywhere on the surface of the slice 37, the circuits, or chips, located near the periphery of the slice 37 are substantially identical in construction and operating characteristics as those circuits located near the center of the semiconductor slice 37. The overall operating characteristics of all circuits on the slice are thereby made more uniform and thus more predictable and reliable as to operation.

The gas dispersion disk 20 of the invention is effective to correct nonuniform process results by radially varying gas flow on the output side of the electrode 10. The gas dispersion disk 20 of FIG. 2 includes apertures formed in concentric circles, rather than in uniform rectangular spacings, as heretofore known in the art. Although five concentric circles of aperture groups are shown, such particular number or arrangement is not necessary to the utilization of the invention. Importantly, the gas dispersion disk 20 has formed therein apertures 22 having a certain aperture area per unit of disk area, which ratio can vary radially outwardly toward the peripheral edge of disk 20. Depending on the reactor pressure gradients involved, the aperture area per unit of disk area may increase, decrease, or remain constant over the surface of the disk. In reactors having high pressures near the outer areas thereof, the aperture area per unit of disk area near the center of the gas dispersion disk 20 may be greater than the corresponding ratio near the outer edge of the disk 20. The amount by which such ratio varies depends, of course, on the particular reactor employed. In the illustrated embodiment, the gas dispersion disk 20 corrects gas distribution in reactors having high gas pressures near the center thereof, and descreasing gas pressures near the outer edge of the reactor chamber.

There are three primary techniques for providing a varying aperture area to disk area in the gas dispersion disk 20. First, the holes can be formed in groups, each group being associated with a concentric circle on the disk 20, and each hole having substantially the same area or diameter. For varying the aperture area, the concentric circles are uniformly spaced apart, but the apertures in each concentric circle are closer together in the concentric circles located near the periphery of the gas dispersion disk 20. As an alternative, rather than forming the apertures closer together in each concentric circle, the holes in outlying groups can be made of a larger diameter. Also, the ratio of aperture area to unit area of the disk 20 can be varied by increasing the number of concentric circles near the periphery of the gas dispersion disk 20. Those skilled in the art may find that other aperture patterns may be advantageous for realizing the principles and concepts of the invention.

As noted above, the gas dispersion disk 20 according to the preferred embodiment of the invention is constructed to counteract pressure gradients having profile characteristics with a greater pressure near the center of the disk 20 and with decreasing pressures near the periphery of the disk 20. To that end, the gas dispersion disk 20 shown in FIG. 2 includes a central apertue 40 of about 0.016 inch in diameter. Each aperture 42 associated with concentric circle 47 is formed with a diameter of about 0.020 inch. The holes associated with concentric circle 46 each have a diameter of about 0.026 inch. In like manner, each hole associated with concentric circle 48 has a diameter of about 0.031 inch. The holes located in concentric circle 50, which are near the peripheral edge of the gas dispersion disk 20, each have a larger diameter, e.g., 0.040 inch. Lastly, the holes associated with the outermost concentric circle 51 are characterized by a diameter of about 0.043 inch. As can be seen, while the holes associated with each concentric circle are spaced apart from each other about the same distance, each group of holes are of different diameters.

FIG. 3 illustrates another embodiment of a gas dispersion mask 52 of the invention. In this embodiment, the gas dispersion mask 52 include a central square area 54 having an aperture size and spacing arrangement similar to a corresponding area of the disk shown above in FIG. 2. Thus, as to the central area 54, the gas vapor passing through the apertures 56 provides a uniform dispersion of gas to the underlying semiconductor slice 37. Lying outside the central area 54 is a nonapertured area 58 for blocking the flow of gas vapors from reaching the semiconductor slice 37. With this gas dispersion mask 52, selected areas of the semiconductor slice 37 can be effectively masked, and thus prevent layers of material from being deposited thereat. When employing a masking dispersion disk 52, it would be preferable to construct the apertured annular ring 39 to also have a corresponding sized internal square opening.

In yet another envisioned embodiment of the invention which is not shown, the apertured and nonapertured areas of the dispersion disk may be reversed from that shown in FIG. 3, whereby the central part 54 would be nonapertured, and the outlying area 58 would include apertures. There exists many other arrangements for constructing gas dispersion disks having apertured and nonapertured areas. The effectiveness of such arrangements may depend upon the process parameters, the particular type of reactor involved, and the selected areas of the semiconductor slice desired to be blocked.

FIG. 4 illustrates, in graphical form, the significant effect of various apertured arrangements in gas dispersion disks employing the invention. The horizontal axis of the graph illustrates the radial locations of a four-inch slice, starting at the center thereof. The vertical axis of the graph illustrates the thickness of the deposited film, graduated generally in hundreds of angstroms.

The curve identified by reference character 60 illustrates a deposition profile, wherein the thickness of a deposited film on the slice was inverted from radially decreasing to radially increasing. The gas dispersion disk effective to produce the response of curve 60 was constructed with apertures defining an open area which increased exponentially from the center of the disk toward the peripheral edge thereof. More particularly, the disk had at the center thereof an open area comprising 0.1%, and 0.6% open area at the peripheral edge of the disk. The diameter of the gas dispersion disk was 4.5 inch diameter which is larger than that of the semiconductor slice 37.

Curve 62 of the graph of FIG. 4 depicts another gas dispersion disk of the invention having an aperture open area which decreases linearly from the center of the disk toward the outer peripheral edge thereof. In particular, such disk had open areas varying linearly from 0.25% open area at the center of the disk, to 0.15% open area at the outer peripheral edge thereof. As can be noted from the curve 62, a significant change in the thickness of the film can be realized at locations at the center of the slice, as compared to the outer edges thereof. Indeed, the difference between the film thickness deposited at the center of the slice and at the outer edge of slice may be as high as 1000 angstroms.

Curve 64 depicts the profile of a film thickness deposited by the gas dispersion disk 20, having the aperture arrangement described above in connection with FIG. 2. As can be seen, the thickness of the film is substantially uniform from the center of the slice to the outer edge thereof. In practice, deposition films which vary no more than about 2%–0.3 sigma over the entire slice can be obtained. This represents a significant advance over single slice reactors heretofore available.

The gas dispersion capabilities of the disk 20 are further enhanced by the apertured annular ring 39, a top view of which is shown in FIG. 5. The apertured annular ring includes a number of apertures 66 spaced equidistantly about the ring. For reactors adapted for processing four inch slices, the apertured annular ring 39 is constructed with seventy-two such apertures, each having a diameter of 0.093 inch. The apertured annular ring itself is stepped, with an annular shoulder 68 formed in the upper annular corner thereof. The cylindrical collimator 44 can then be fitted over the reactor chamber apparatus, thereby enclosing the same, and rest on the shoulder 68 of the apertured annular ring 39.

As can be seen from FIG. 1, the apertured annular ring 39 is of a diameter somewhat larger than the apparatus above it, and thus the cylindrical collimator 44 can be lowered over such apparatus to rest on the shoulder 68 of the apertured annular ring 39. The apertures 66 extend throggh the radially wider part 68 of the ring 39 which, for four inch slices, has an outside diameter of 5.28 inches and an inside diameter of 4.34 inches. The outside diameter of the narrower part 70 of the ring 39 is 4.80 inches. With these dimensions, a four inch slice 37 can be easily accommodated therein, without leaving substantial additional peripheral area where undesired deposits of material can occur.

With the provision of the apertured annular ring 39, in conjunction with the gas dispersion disk 20, a more uniform reactive gas pressure is maintained across the plasma volume which exists adjacent the upper surface of the slice 37. The holes 66 in the apertured annular ring 39 function to provide a flow resistance to the plasma gases within the chamber portion adjacent the slice 37, and thus induce a uniform plasma gas pressure across the slice 37. Uniformity of material layer thickness is thereby enhanced.

In the preferred embodiment of the invention, the apertured annular ring 39 is constructed with a dielectric material, such as a quartz, ceramic or other material capable of withstanding high temperatures typically found in semiconductor processing. In order to accommodate the processing of semiconductor slices of diameters smaller than the conventional four inch slice, the apertured annular ring 39 can be made with a smaller inside diameter, but with the same outside diameters noted above. With this construction, different size slices can be processed in the same reactor by changing only the apertured annular ring 39. Also, any accumulation of deposition material on the ring 39 can be easily removed, without the time consuming chore of disassembling the reactor components, which was frequently required in well known reactors.

From the foregoing, disclosed is a gas dispersion disk which allows correction of the nonuniformities in gas vapor pressures existing within a chemical vapor transport system. This is accomplished by altering the gas flow over the slice in such a manner as to counteract the pressure gradients which are inherent in single slice chemical vapor transport reactors. The principles and concepts of the invention can be employed in plasma reactors for both deposition and etching purposes.

While the embodiments of the methods and apparatus have been disclosed with reference to specific structures, it is to be understood that many changes in detail may be made as a matter of engineering choices without departing from the spirit and scope of the invention as defined by the appended claims.

What is claimed is:

1. A gas dispersion disk for use in a chemical vapor transport system exhibiting a gas pressure gradient, comprising a disk having a plurality of apertures formed therein and distributed over the surface thereof so as to have a low aperture area per unit of disk area at disk locations exposed to high gas pressures, and a higher aperture area per unit of disk area at disk locations exposed to lower gas pressures.

2. The gas dispersion disk of claim 1, wherein said disk has said higher aperture area per unit of disk area at a central part of said disk.

3. The gas dispersion disk of claim 1, wherein said apertures are arranged in concentric circles.

4. The gas dispersion disk of claim 1, wherein said disk includes an equal number of said apertures per unit area of said disk, with said apertures radially remote from the center of said disk being larger in diameter than the apertures located proximate the center of said disk.

5. The gas dispersion disk of claim 1, wherein said plurality of apertures are each of substantially equal size, and said disk includes more apertures per unit area of said disk at areas radially remote from the disk center than at areas located proximate the center of said disk.

6. The gas dispersion disk of claim 4, wherein said apertures include a general diameter of about 0.02 inch proximate the center of the said disk, and including aperture diameters of about 0.043 near the edge of said disk, and other said apertures located therebetween have diameters between 0.020 and 0.043 inch.

7. The gas dispersion disk of claim 6, wherein said disk includes five groups of apertures, said groups being arranged in concentric circles.

8. The gas dispersion disk of claim 1, wherein said disk is constructed of anodized aluminum.

9. The gas dispersion disk of claim 1, further including selected areas of said disk being apertureless so as to block the diffusion of gases therethrough and thus prevent gases from reaching a corresponding area of a slice located adjacent said disk.

10. The gas dispersion disk of claim 1, including in combination a plasma reactor for dispersing plasma gases through said disk for depositing a uniform layer of material on a slice.

11. The gas dispersion disk of claim 10, further including in combination, an apertured annular ring located adjacent said slice for exhausting plasma gases from said reactor.

12. Plasma reactor apparatus for depositing a uniform layer of material on a slice, comprising:
  an electrode with a gas inlet for providing a gas flow to a reactor chamber of a reactor;
  a gas distribution plate for distributing the gas emitted from said electrode into said chamber;
  a gas dispersion disk having a nonuniform apertured area over the surface thereof for counteracting chamber gas pressure gradients so as to provide a uniform gas pressure to said slice;

a shower head for dispersing said uniform gas pressure in said chamber to said slice;

a spacer for separating said shower head from said gas dispersion disk;

a slice holder for holding a slice exposed to said uniform gas pressure; and means for exhausting said gas from said chamber.

13. The reactor apparatus of claim 12, wherein said gas dispersion disk includes a high aperture area per unit of disk area at disk locations exposed to low gas pressures.

14. The reactor apparatus of claim 12, wherein said gas dispersion disk includes a high density of disk open areas proximate an edge thereof, as compared to an open area proximate the center of said disk.

15. The reactor apparatus of claim 12, wherein said gas exhaust means comprises an annular ring having exhaust outlets spaced therearound.

16. A method of dispersing a gas in a chemical vapor transport system exhibiting a gas pressure gradient, comprising the steps of:

separating a gas inlet chamber area which exhibits said pressure gradient from a slice processing area by a barrier for restricting the flow of gas from the inlet chamber area to the slice processing area such that in the high gas pressure areas there is a higher restriction than in low gas pressure areas.

17. The method of claim 16, further including dividing said chamber with a barrier having a nonuniform apertured area over a surface thereof, which nonuniformity corresponds to pressure gradients within said chamber.

18. The method of claim 17, further including forming in said barrier an aperture density proximate an edge thereof which is greater than an aperture density proximate a central part of the disk.

19. The method of claim 16, further including restricting the flow of gas from said inlet chamber area to said slice processing area more at central areas thereof than at peripheral areas thereof.

20. The method of claim 16, further including exhausting said gas from said slice processing area by plural exhaust ports spaced around said slice processing area.

21. The method of claim 16, further including dispersing a gas effective to etch a material utilized in a semiconductor process.

22. The method of claim 16, further including dispersing a gas effective to deposit a material utilized in a semiconductor process.

* * * * *